United States Patent
Akhtar et al.

(10) Patent No.: US 12,126,309 B2
(45) Date of Patent: Oct. 22, 2024

(54) METHODS AND APPARATUS FOR VOLTAGE BUFFERING

(71) Applicant: TEXAS INSTRUMENTS INCORPORATED, Dallas, TX (US)

(72) Inventors: Siraj Akhtar, Richardson, TX (US); Swaminathan Sankaran, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 147 days.

(21) Appl. No.: 16/557,571

(22) Filed: Aug. 30, 2019

(65) Prior Publication Data

US 2020/0076374 A1   Mar. 5, 2020

Related U.S. Application Data

(60) Provisional application No. 62/725,832, filed on Aug. 31, 2018.

(51) Int. Cl.
| | |
|---|---|
| H03F 1/26 | (2006.01) |
| H03F 3/183 | (2006.01) |
| H03F 3/45 | (2006.01) |
| H03H 11/28 | (2006.01) |
| H03F 1/30 | (2006.01) |
| H03F 3/50 | (2006.01) |

(52) U.S. Cl.
CPC ............ H03F 1/26 (2013.01); H03F 3/183 (2013.01); H03H 11/28 (2013.01); *H03F 1/306* (2013.01); *H03F 3/505* (2013.01); *H03F 2200/03* (2013.01); *H03F 2200/318* (2013.01)

(58) Field of Classification Search
CPC ...... H03F 1/26; H03F 3/183; H03F 2200/318; H03F 2200/03; H03F 3/181; H03F 3/50; H03H 11/28
USPC ................................ 330/277, 283, 252–261
See application file for complete search history.

(56) References Cited

U.S. PATENT DOCUMENTS

| | | | |
|---|---|---|---|
| 5,557,238 A | 9/1996 | Weiss | |
| 6,175,279 B1* | 1/2001 | Ciccarelli | H04B 1/109 330/296 |

(Continued)

FOREIGN PATENT DOCUMENTS

| | | |
|---|---|---|
| CN | 201608817 U | 10/2010 |
| EP | 3319231 A1 | 5/2018 |
| JP | 2004253919 A | 9/2004 |

OTHER PUBLICATIONS

International Search Report for PCT/US2019/049089 dated Dec. 5, 2019.
European Search Report dated Aug. 10, 2021.

*Primary Examiner* — Andrea Lindgren Baltzell
*Assistant Examiner* — Khiem D Nguyen
(74) *Attorney, Agent, or Firm* — Frank D. Cimino (57) ABSTRACT

In an example apparatus, a first transistor has a base terminal, a first current terminal and a second current terminal. The base terminal is coupled to an input voltage node. A second transistor has a control terminal, a third current terminal and a fourth current terminal. The third current terminal is coupled to the second current terminal. The fourth current terminal is coupled to a first resistor. A second resistor is coupled to the control terminal. An inductor is coupled between the first resistor and a ground terminal.

19 Claims, 5 Drawing Sheets

(56) References Cited

U.S. PATENT DOCUMENTS

| | | | |
|---|---|---|---|
| 6,396,347 B1 * | 5/2002 | Lie | H03G 1/0088 330/285 |
| 6,429,744 B2 | 8/2002 | Murray et al. | |
| 6,437,612 B1 * | 8/2002 | Dasgupta | H03F 1/308 327/54 |
| 7,099,646 B1 * | 8/2006 | Jin | H03D 7/1425 331/117 R |
| 7,145,395 B2 * | 12/2006 | Gudem | H03F 1/3211 330/283 |
| 7,378,909 B2 * | 5/2008 | Tomizawa | H03G 1/0088 330/133 |
| 7,439,805 B1 * | 10/2008 | Kobayashi | H01L 28/10 330/296 |
| 7,746,042 B2 | 6/2010 | Williams et al. | |
| 7,948,322 B2 * | 5/2011 | Lee | H03F 3/265 330/117 |
| 9,537,457 B2 * | 1/2017 | Issakov | H03F 1/0272 |
| 10,243,523 B2 * | 3/2019 | Heydari | H03F 3/08 |
| 2009/0219092 A1 * | 9/2009 | Kim | H03F 3/45201 330/252 |
| 2018/0069508 A1 * | 3/2018 | Seshita | H03F 3/193 |
| 2019/0379340 A1 * | 12/2019 | Rattan | H03F 3/45475 |

\* cited by examiner

METHODS AND APPARATUS FOR VOLTAGE BUFFERING

CROSS-REFERENCE TO RELATED APPLICATION

This patent application claims the benefit of and priority to U.S. Provisional Patent Application Ser. No. 62/725,832 filed Aug. 31, 2018, which is hereby incorporated herein by reference in its entirety.

TECHNICAL FIELD

This relates generally to buffering, and more particularly to voltage buffering.

BACKGROUND

A first voltage amplifier stage can be used as a buffer between a voltage input and a second voltage amplifier stage. A voltage gain of an amplifier is a ratio of the amplifier output voltage to the amplifier input voltage. When an amplifier is used as a buffer, typically the voltage gain of the amplifier is one, which is also referred to as unity gain. Voltage amplifiers can be single-stage or multi-stage, where a multi-stage voltage amplifier includes a number of cascaded single-stage voltage amplifiers. Single-stage voltage amplifiers may have many topologies, such as an inverting voltage amplifier, a current follower amplifier, a voltage follower amplifier, etc.

In an example voltage follower amplifier, the voltage at the output approximately follows the voltage at the input. One example voltage follower topology includes a bipolar junction transistor (BJT) connected in an emitter follower configuration. Another example voltage follower topology includes a metal-oxide semiconductor field effect transistor (MOSFET) connected in a common drain configuration.

SUMMARY

In an example apparatus, a first transistor has a base terminal, a first current terminal and a second current terminal. The base terminal is coupled to an input voltage node. A second transistor has a control terminal, a third current terminal and a fourth current terminal. The third current terminal is coupled to the second current terminal. The fourth current terminal is coupled to a first resistor. A second resistor is coupled to the control terminal. An inductor is coupled between the first resistor and a ground terminal.

DETAILED DESCRIPTION

The drawings are not to scale. Generally, the same reference numbers in the drawing(s) and this description refer to the same or like parts. Although the drawings show layers and regions with clean lines and boundaries, some or all of these lines and/or boundaries may be idealized. In reality, the boundaries and/or lines may be unobservable, blended and/or irregular.

In at least one example, a buffering circuit is used to transfer a voltage from a first circuit, having a high output impedance, to a second circuit having a low input impedance. As used herein, impedance is an effective resistance of an electric circuit or component to alternating current. Impedance represents a combined effect of ohmic resistance (e.g., resistance due to resistive components) and reactance (e.g., resistance due to inductive and capacitive components). Examples of a buffering circuit include an emitter follower amplifier, a voltage buffer, a common collector amplifier, a common source amplifier, a buffer amplifier, etc. In some examples, buffering circuits are used for impedance matching between an output of a first circuit and an input of a second circuit. For example, an emitter follower may be used when any input signal, such as an audio signal, is to be reproduced at a loudspeaker at an audible frequency range.

In other examples, buffering circuits drive loads with high operating voltages (e.g., high voltages can vary depending on application, such as: 5 volts, 50 volts, 80 volts, etc.), but low operating currents (e.g., tens of milliamps). In an example operation, buffering circuits are useful to generate an output voltage that matches the input voltage of the buffering circuit at the load, so the buffering circuit maintains the output voltage independent of the current load drawn from the output terminal, which is also known as buffering the input. Some buffering circuits include current sources at the outputs of the buffering circuits.

In operation and implementation, an emitter follower includes a first transistor, such as a BJT, which forces the voltage at an emitter terminal of the BJT to follow the voltage at the base terminal of the BJT. The base terminal of the BJT is coupled to an input node and is configured to receive an input signal at the input node. The input signal may be an audio or radio frequency signal, an output voltage from a preceding amplifier stage, etc. The emitter terminal of the first transistor is coupled to a second transistor (such as a BJT, MOSFET, etc.). The second transistor is coupled between the emitter terminal of the first transistor and ground. In such a configuration, the second transistor operates as a current source. For example, the second transistor provides high impedance at the emitter terminal of the first transistor while setting the bias current of the first transistor. The second transistor passes a constant standing current through a collector terminal of the first transistor when the collector terminal of the first transistor is coupled to a supply voltage node and receives no incoming input signal.

In an example operation of an emitter follower with a current source, the first transistor base terminal receives the input signal. In some examples, the input signal is swinging (e.g., varying between a relatively high voltage and a relatively low voltage). Under certain conditions (e.g., when manufacturing specifications of the second transistor are met), the second transistor, which is acting as the current source, allows the output signal of the first transistor to swing with the input signal. As used herein, an "output swing," "signal swing," "voltage swing," and "current swing" are terms used to refer to the excursions of the input signal value and time. For example, if the input signal is a sine wave with an amplitude of 1, the signal "swings" from 1 to −1. The units for a signal swing can be voltage, current, frequency, etc. (such as 1 volt, 1 ampere, 1 kHz, etc.). In other examples, under conditions where the manufacturing specifications of the second transistor are not met, the second transistor does not allow the output signal to swing with the input signal.

An emitter follower is designed to faithfully represent the input signal at the output. Therefore, the emitter follower is to always follow the swing of the input signal. For conditions where the manufacturing specifications are not met (such as when input voltages are too high for the type of BJT, transistor, MOSFET, etc.) the output does not faithfully follow the swing of the input. For example, a type of MOSFET acting as the current source has specifications corresponding to the amount of input voltage the MOSFET should receive. Such specifications of the MOSFET are based on the physical size of the MOSFET. The physical size of the MOSFET is related to a limit of voltage that can pass through the MOSFET before the reliability of the MOSFET is affected. Limits of voltage include a limit on how much voltage a drain terminal and a source terminal (Vds) of the MOSFET can generate. For example, the Vds (of the MOSFET acting as the current source) is a limited value, and the MOSFET is specified to handle no more than a threshold above or below the limited value. If the input signal swings down to a voltage value below the threshold value of the MOSFET, the Vds of the MOSFET is greatly diminished, so output clipping occurs at the output of the emitter follower (e.g., the emitter terminal). Clipping is a form of waveform distortion that occurs when an amplifier (such as the emitter follower amplifier, voltage buffer amplifier, etc.) is overdriven (e.g., does not meet manufacturing specifications) and attempts to deliver an output voltage or current beyond its maximum capability. In hard clipping, the amplitude of a signal is limited to a maximum amplitude, so the waveform does not have rounded tops and bottoms, but instead are flat or cut-off. In soft clipping, the amplitude of a signal is saturated along a smooth curve, rather than the abrupt shape of hard clipping. Soft clipping is also known as voltage compression because the amplitude of the waveform is smaller (compressed) relative to amplitude of the input signal. As a result of the clipping, the output signal does not faithfully follow the input signal.

Output clipping is a significant problem because output clipping introduces non-linearity to the emitter follower. When a system, such as the emitter follower, is non-linear, the output of the system is not equal to the input. For example, if the emitter follower has increasing non-linearity due to the Vds of the current source MOSFET being diminished, then most likely the output signal of the emitter follower is not following the input signal (e.g., the output signal is distorting when the input voltage exceeds manufacturing specifications). The non-linearity is an undesirable effect, because an emitter follower is designed and implemented for a specified use as a buffer, to maintain the voltage of the input at the output for a load.

Examples apparatus and systems described herein minimize and/or eliminate non-linearity of an emitter follower with a current source MOSFET by including an inductor coupled to an output of the current source MOSFET. For example, apparatus described herein eliminate clipping of the output signal by including the inductor. Also, examples described herein reduce voltage compression of the emitter follower, caused by the clipping of the output signal swing.

Non-linearity of the emitter follower is eliminated due to the reduction of voltage compression in the emitter follower. Further, apparatus described herein reduce the modulation in the emitter follower when the voltage swing is beyond a threshold value. In this manner, linearity of the emitter follower is improved, a one decibel (1 dB) compression point is extended to a new value, and noise generated during a high-frequency input signal is reduced.

Commonly, when linearity of a device is improved, the 1 dB compression point of the device also improves (e.g., extends). For example, the 1 dB compression point (e.g., OP1 dB, P1 dB) is the point at which the current of the input signal causes the gain of the device at the output to decrease 1 dB from the normal linear gain of the output. Most linear amplifiers have a fixed gain for a specific frequency range. If output signal versus input signal is plotted on a graph, a linear relationship is illustrated. The slope of the line is the gain. As the frequency of the input signal continues to increase, at some point the gain begins to decrease. The amplifier enters compression, in which no further output increases occur responsive to an input increase. Extending the P1 dB includes increasing the amount of input signal (e.g., the voltage of the signal) to a device before the output signal compresses.

Figure 1:
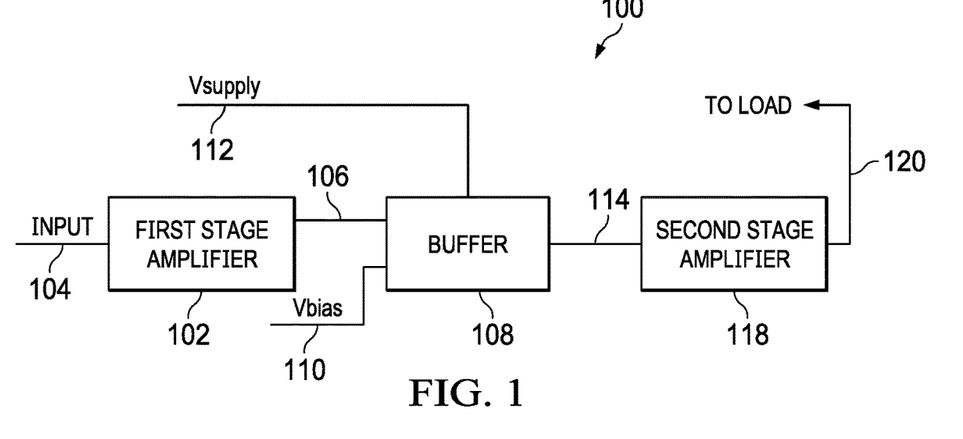
FIG. 1 is a schematic illustration of an example amplifier system.

FIG. 1 is a schematic illustration of an example amplification system 100. In some examples, amplification systems use voltage buffers, emitter followers, source followers, etc., for buffering a signal provided by an input terminal. The amplification system 100 includes an example first stage amplifier 102 including a first stage input 104 and a first stage output 106. The amplification system 100 includes an example buffer 108 coupled to the first stage output 106, a bias voltage terminal (Vbias) 110, and a voltage supply (Vsupply) 112. An output 114 of the buffer 108 is coupled to a second stage amplifier 118 including a load output 120.

In FIG. 1, the amplification system 100 includes the first stage amplifier 102 to receive the first stage input 104 and adjust the amplitude of the first stage input 104 based on a respective load. For example, the first stage input 104 may be a sine wave with a negligible value relative to a load, such as a speaker. The first stage amplifier 102 may operate to increase and/or boost the amplitude of the first stage input 104, reproduce the amplitude of the first stage input 104, etc. The first stage amplifier 102 provides the adjusted input signal via the first stage output 106 to the buffer 108. The first stage amplifier 102 may be a voltage amplifier, a current amplifier, an operational amplifier, a MOSFET, a BJT, or any other electrical device suitable to adjust the amplitude of the first stage input 104.

In FIG. 1, the amplification system 100 includes the buffer 108 to buffer the received first stage output 106 for the second stage amplifier 118. As used herein, the first stage output 106 will be referred to as input 106 such that voltage and current on "first stage output" 106 and "input" 106 are equal. The buffer 108 is configured to receive the supply voltage 112, via a supply voltage terminal, and the bias voltage, via the Vbias 110, for specified operation of the buffer 108. In some examples, the buffer 108 may be an emitter follower, a source follower, a common collector amplifier, and/or any other device that may buffer an input voltage. In examples described herein, the buffer 108 includes a single ended output (e.g., 114) with a single ended input 106. Alternatively, the buffer 108 may be a differential buffer amplifier configured to receive two inputs and include two outputs relative to a non-differential buffer amplifier with a single ended input and a single ended output.

In some examples, the buffer 108 receives the input 106 as a sine wave and reproduces (e.g., buffers) the sine wave at the output 114. The buffer 108 is described in further detail below in connection with FIGS. 2 and 3.

In FIG. 1, the amplification system 100 includes the second stage amplifier 118 to increase the gain applied to the input 106 in addition to the gain applied to the first stage input 104 by the first stage amplifier 102. For example, overall voltage gain can be increased when a number of amplifier stages are used in succession. For example, if the first stage amplifier 102 has a gain of 10 and the second stage amplifier 118 also has a gain of 10, then the total gain applied to the original first stage input 104 is 20, so the first stage input 104 receives double the amount of gain than the first stage input 104 would have received if only one amplifier existed.

In some examples, the second stage amplifier 118 increases the total gain applied to the first stage input 104 for a load. For example, the load is a speaker and the first stage input 104 is an audio signal. The second stage amplifier 118 increases the audio signal to a value that meets a threshold for the speaker to produce an audible frequency (e.g., audio that can be heard by a user). In this manner, the amount of gain produced by the second stage amplifier 118 can determined by the load.

In some examples, a buffer (e.g., the buffer 108) does not exist between the first stage amplifier 102 and the second stage amplifier 118. In the absence of a buffer, the impedance on the first stage amplifier 102 is the input resistance (e.g., impedance) of the second stage amplifier 118. If the first stage amplifier 102 directly controls the second stage amplifier 118, the 'low' input impedance of the second stage amplifier 118 will 'load' down the first stage amplifier 102, therefore decreasing the voltage swing. Therefore, it is desirable to include a voltage amplifier/buffer (such as an emitter follower, source follower, etc.) between the two amplifier stages (e.g., 102, 118) to increase the impedance at the load. By inserting the buffer 108, the impedance between the first stage amplifier 102 and the load is now a high impedance. As a result of the high impedance, the swing out of the first stage amplifier 102 is not loaded down. The buffer 108 then reproduces the output swing on the buffer output 114 to drive the second stage amplifier 118.

The second stage amplifier 118 may be a voltage amplifier, a current amplifier, an operational amplifier, a MOSFET, a BJT, or any other electrical device suitable to adjust the amplitude of the signal on the output 114.

Figure 2:
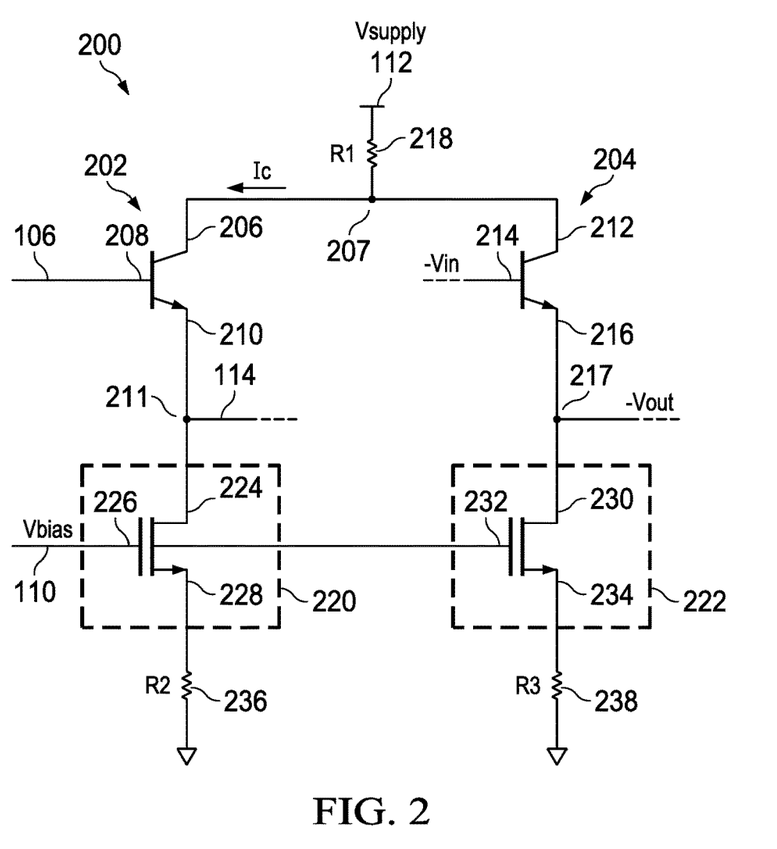
FIG. 2 is a schematic illustration showing an implementation of the buffer of FIG. 1.

FIG. 2 is a schematic illustration showing additional detail of an implementation of the buffer of FIG. 1. The buffer includes a first transistor 202, a second transistor 204, a first resistor 218, a first current source 220, and a second current source 222. In the buffer, the right side of the schematic (e.g., the second transistor 204 and the second current source 222) can be identified as a replica of the left side of the schematic (e.g., the first transistor 202 and the first current source 220) because the buffer of FIG. 2 is a differential implementation. A differential implementation can be referred to as an implementation that includes a non-inverted input (106), an inverted input (dashed line coupled to a second base terminal 214), a non-inverted output (114), and an inverted output (the dashed line coupled to emitter node 217). The buffer of FIG. 2, when operating in a large signal operation (e.g., a large signal is relative to the size of transistors and resistor), illustrates undesired characteristics such as clipping, unintended modulation, reduced compression point (OP1 dB), and increased intermodulation distortion (IMD3).

As used herein, when referring to "the first transistor 202," it is to be understood that the description and/or illustration applies to both the first transistor 202 and the second transistor 204. Similarly, when referring to the "first current source 220," it is to be understood that the description and/or illustration applies to both the first current source 220 and the second current source 222. In this manner, the second transistor 204 and the second current source 222 replicas of the first transistor 202 and the first current source 220 and can be understood to operate in an identical manner as each other. However, the second transistor 204 receives an input signal from input 106 that is 180 degrees out-of-phase with the input signal applied to the first transistor 202.

In FIG. 2, the buffer includes the first transistor 202 and the second transistor 204 to conduct current from a collector terminal to an emitter terminal. The first transistor 202 includes a first collector terminal 206 coupled to the first resistor 218 at a collector node 207, a first base terminal 208 coupled to input 106 and configured to receive an input signal via input 106, and a first emitter terminal 210 coupled to output 114 at an emitter node 211. The second transistor 204 includes a second collector terminal 212 coupled to the first resistor 218 and the first collector terminal 206 at the collector node 207, a second base terminal 214 coupled to an inverse input and configured to receive an inverse input signal (−Vin) (which is an inverse of the input signal at input 106), via the inverse input, and a second emitter terminal 216 coupled to an output at an emitter node 217, the output having an inverse output signal (−Vout) (which is an inverse of the output signal at output 114).

In FIG. 2, the first transistor 202 and the second transistor 204 are N-type (NPN) BJTs. The first transistor 202 and second transistor 204 are either on (e.g., conducting) or off (e.g., not conducting). When the transistors 202 and 204 are on, the base terminals 208 and 214 may vary the amount of current conducting through the collector terminals 206, 212 or may not vary the amount of current conducting through the collector terminals 206, 212. In FIG. 2, the transistors 202, 204 are usually always on for the transistors 202, 204 to reproduce the input signal 106. In this manner, the voltage at collector node 207 (e.g., provided by Vsupply 112 and the resistance of R1 218) sets the collector voltage.

Further, in FIG. 2, the first resistor 218 is included in the buffer to shift the DC voltage provided to the first collector terminal 206 and the second collector terminal 212. The supply voltage 112 may be large compared to the input voltage on input 106 and output voltage on output 114. The first transistor 202 generates the voltage at the output 114 responsive to the voltage at the input 106. Accordingly, when the input voltage of the first transistor 202 decreases, the voltage at the output 114 also decreases. The decreased voltage on the output 114 increases the collector to emitter voltage (Vce) of the first transistor 202. If the supply voltage 112 is more than a threshold value of collector-to-emitter voltage (Vce) of the transistor 202, the first transistor 202 may be damaged. Therefore, the first resistor 218 is introduced to bias the Vce of the first transistor 202 within the operating conditions of the first transistor 202.

In FIG. 2, the buffer includes the first current source 220 and the second current source 222 to bias the current at the first emitter terminal 210 and the second emitter terminal 216. The first current source 220 includes a first drain terminal 224 coupled to the first emitter terminal 210 at emitter node 211, a first control terminal 226 (e.g., gate) coupled to Vbias 110, and a first source terminal 228 coupled to a second resistor (R2) 236. The second current source 222 includes a second drain terminal 230 coupled to the second emitter node 217, a second control terminal 232 (e.g., gate) coupled to Vbias 110, and a second source terminal 234 coupled to a third resistor (R3) 238.

In FIG. 2, the first current source 220 is an n-channel MOSFET (NFET) that operates as a current mirror and essentially biases the current at emitter node 211. Alternatively, the first current source 220 could be an NPN BJT, a PNP BJT, a p-channel MOSFET (PFET), etc. A current mirror copies a current conducting through one active device by controlling the current conducting through a different active device while keeping the current constant. For example, the first current source 220 sets the current flowing into emitter terminal 210 of the first transistor 202.

An NFET includes two current terminals and a control terminal (e.g., gate), in which a first current terminal is a drain terminal, and a second current terminal is a source terminal. The control terminal of an NFET controls the current that conducts from the drain terminal to the source terminal. The NFET operates in a saturation mode when gate-to-source voltage (Vgs)>threshold voltage (Vth) and when the drain-to-source voltage (Vds) is greater than Vgs minus the Vth (e.g., Vgs>Vth; Vds>Vgs−Vth). When the NFET is in saturation mode, the drain terminal and source terminal operate as a current source. After the voltage has exceeded the threshold for saturation, current conducting through the two terminals does not vary greatly responsive to an increasing Vds voltage. After Vds surpasses the Vth, the transistor operates as a current source, and the current does not change when Vds increases beyond the saturation voltage.

The first current source 220 operates in saturation mode as a current source to the first transistor 202. In this manner, the voltage at Vbias 110 is a constant bias voltage, so the current conducting through the first drain terminal 224 to the first source terminal 228 is constant. The voltage at Vbias 110 is set to a value relative to the voltage signal that is on input 106.

In FIG. 2, the first source terminal 228 is coupled to R2 236. R2 236 is a degeneration resistor. A degeneration resistor is useful in current source designs to "degenerate" or decrease the gain of the current source transistor, but it improves other aspects, such as linearity and output impedance. The degeneration resistor R2 236 minimizes noise produced at the first source terminal 228. Also, R2 236 sets the voltage at the first source terminal 228. The voltage at the source terminal 228 is determined by the current flowing through R2 236 multiplied by the resistance (e.g., ohms). The current flowing through R2 236 may be the current from the first drain terminal 224.

In operation of the buffer, an incoming voltage signal is applied to input 106. As used herein, the voltage signal on input 106 is Vin. Usually, Vin swings. When Vin swings, the output 114 swings. Vin is applied to the first base terminal 208 and, when Vin swings, the voltage at the first emitter terminal 210 begins to swing.

Also, because the voltage at the first emitter terminal 210 is swinging, the voltage at the first collector terminal 206 may swing. However, the buffer is a differential implementation, which is indicative of the second transistor 204 receiving the input 106 that is adjusted to be 180 degrees out-of-phase with the Vin signal. Because of this differential implementation, the voltage at the second collector terminal 212 cancels the voltage swinging at the first collector terminal 206 when Vin swings. In this manner, the voltage at the first collector terminal 206 and the voltage at the second collector terminal 212 have opposite polarities, opposite phases, etc. Further, the node 207 is a quiet node because the two voltages at first collector terminal 206 and second collector terminal 212 are canceling each other. In this manner, the only fluctuation of voltage generated in the buffer occurs on the input 106 and the output 114.

The voltage on the output 114 swings in a positive direction or a negative direction. If Vin increases, the voltage on the output 114 swings in the positive direction because Ic is decreasing. The voltage on the output 114 can increase until the voltage reaches the voltage of Vsupply 112. When the voltage on the output 114 reaches Vsupply 112, zero voltage drop exists across the resistance at the first collector terminal 206, which is indicative of zero Ic. The first transistor 202 does not conduct current when Ic is zero and, responsive thereto, the first transistor 202 enters a cut-off mode (e.g., turned off).

If Vin decreases, the voltage on the output 114 swings in the negative direction because Ic is increasing. The voltage on the output 114 can decrease until the voltage on the output 114 equals the drain-to-source voltage (Vds) of the current source 220 that does not meet the threshold voltage to keep the MOSFET turned on. For the current source 220 to operate in a linear mode (e.g., turned on and conducting), the Vds of the current source 220 needs to be greater than the gate-to-source voltage (Vgs) minus the threshold voltage (Vth) (e.g., Vgs>Vth; Vds>Vgs−Vth). When the voltage on the output 114 swings in the negative direction, Vds may drop below the Vgs minus Vth voltage and thus turn off the current source 220.

The operation of the current source is determined by the bias voltage at Vbias 110. The voltage at Vbias 110 is a constant voltage that determines a DC current conducting through the current source 220. The voltage at Vbias 110 sets the Vgs, which determines the current conducting through the current source 220. The current conducting through the current source 220 is equal to Ic, which is the current conducting at the first collector terminal 206. In an operation of the buffer of FIG. 2, if the incoming voltage signal Vinp is swinging, the voltage at the first emitter terminal 210 swings, and the voltage at the first collector terminal 206 remains unchanged. The voltage at the first collector terminal 206 does not change (such as modulate, wiggle, swing, etc.) because the node 207 is a quiescent node and holds the voltage at the first collector terminal 206 (and the voltage at the second collector terminal 212) at a zero potential. In this manner, the collector-to-emitter voltage (Vce) is varying. Also, when the voltage at emitter node 211 swings in a negative direction, the voltage at the first drain terminal 224 begins to drop. When the voltage at the first drain terminal 224 is dropping, the Vds of the current source 220 begins to modulate (such as change, vary in amplitude, etc.), and the current flowing through the MOSFET changes.

It is undesired for the Vds of a current source (e.g., the current source 220) to drop below Vgs−Vth. For example, if Vds of the current source 220 drops below Vgs−Vth, then an ideal, specified and/or desired current source does not specify the current conducting through the MOSFET to modulate as the Vds modulates. The current source 220 of the buffer of FIG. 2 may modulate due to a certain value of "headroom." Headroom is a characteristic of a MOSFET that is defined during the manufacturing of a MOSFET. The headroom of a MOSFET determines a tolerance or threshold range of drain-to-source voltage swing in which the drain current (Id) will not change. For example, a manufacturer can design a MOSFET to tolerate a voltage swing at the input (e.g., the voltage at the control terminal of the MOS- FET) of a value between −1 volt and 1 volt. If the input voltage decreases below −1 volt (e.g., −1.5 volts), the drain current begins to clip (e.g., decrease).

Figure 3:
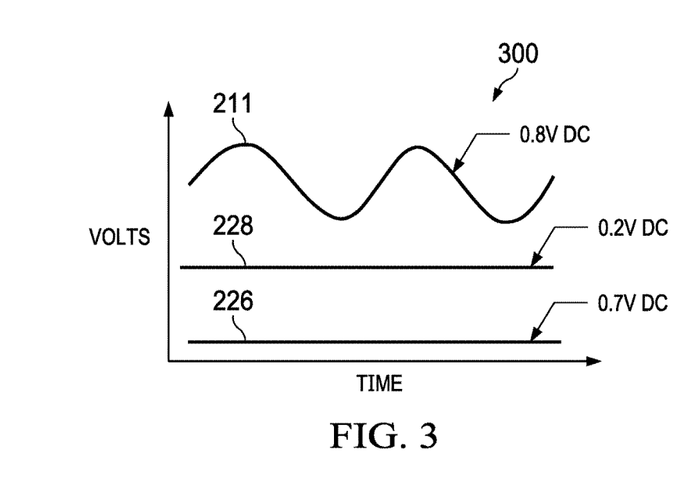
FIG. 3 is a signal plot illustrating voltage signals of the buffer of FIG. 2.

Referring to FIG. 3, the signal plot 300 illustrates the voltage at the first control terminal 226 (e.g., the voltage provided by the Vbias 110), the voltage at the first source terminal 228, and the voltage at the first emitter terminal 210 (e.g., the voltage at the first emitter terminal 210 is also equal to the voltage at emitter node 211, the voltage at the output 114, and the voltage at the first drain terminal 224). The gate voltage (e.g., the voltage at Vbias 110) is held and/or maintained at a constant value (e.g., 0.7 volts). In response to the gate voltage held at the constant value, the source voltage at the first source terminal 228 is also held at a constant value (e.g., 0.2 volts).

The voltage at the first emitter terminal 210 (e.g., the voltage at the first drain terminal 224, the voltage at the emitter node 211) is illustrated as a sine wave due to the swinging of the incoming voltage signal on input 106. The average voltage (DC) of the sine wave at the first emitter terminal 210 equals 0.8 volts. In operation, as the emitter voltage (e.g., the voltage at the first drain terminal 224) moves from 0.8 DC to 0.8 DC minus a voltage swing, the Vds of the first current source 220 begins to decrease below the voltage at Vbias 110 minus the threshold voltage. When the Vds of the first current source 220 decreases below the voltage at Vbias 110, the drain current of the first current source 220 clips responsive to the reduction in headroom of the first current source 220.

An issue arises with the buffer of FIG. 2 when the emitter voltage at the first emitter terminal 210 fluctuates drastically beyond a specified value of operation of the current source 220. Usually, the drain-to-source voltage of the current source 220 does not affect the drain current (e.g., the current at emitter node 211) until the drain-to-source voltages reaches a certain value (e.g., a voltage value defined by a manufacturer as the threshold amount of swing the MOSFET can experience until compression occurs). As illustrated in FIG. 3, the emitter voltage exceeds the threshold value defined by manufacturers, and this causes the drain current (e.g., the current at the emitter node 211) to become negatively affected by the drain-to-source voltage of the first current source 220. When the drain current begins to clip, the buffer is no longer usable (e.g., due to increased non-linearity/compression) for operation in the amplification system 100 of FIG. 1.

Figure 4:
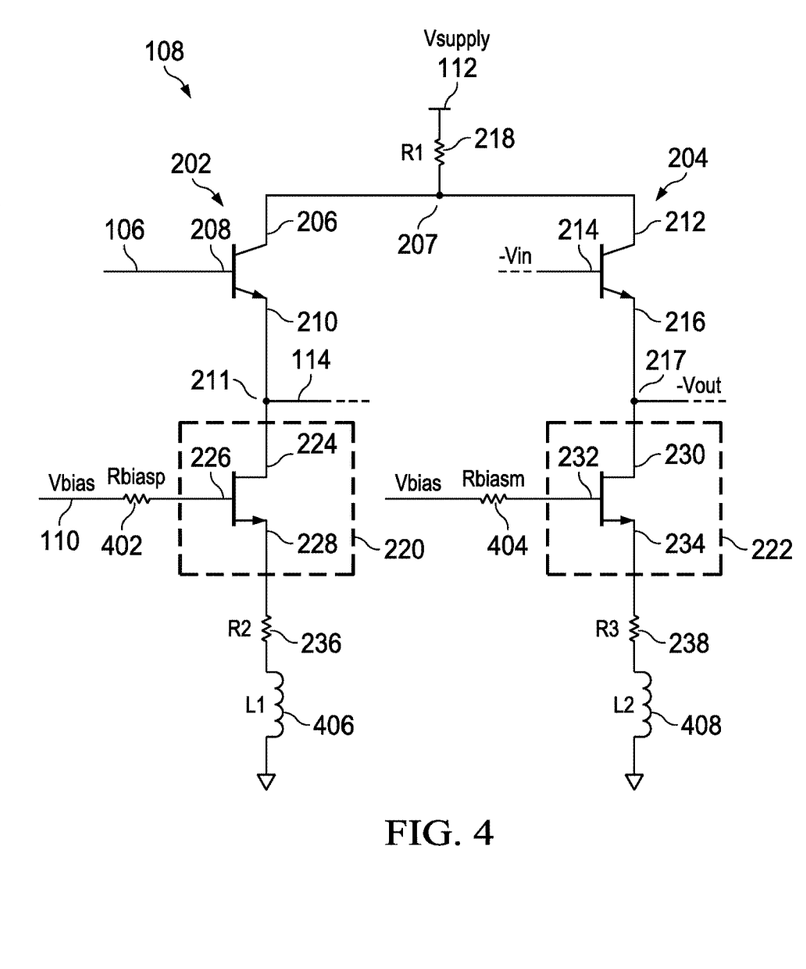
FIG. 4 is a schematic illustration of an example circuit implementation of the buffer of FIG. 1 including bias components.

The example of FIG. 4 shows additional detail of an implementation of the buffer 108 of FIG. 1 including a bias resistor and an inductor. The buffer 108 of FIG. 4 overcomes challenges and issues of the buffer of FIG. 2 (e.g., which does not include inductors and bias resistors), as described above in connection with FIGS. 2 and 3. The buffer 108 of FIG. 4 includes an input terminal (e.g., input 106), an output terminal (e.g., output 114), the first transistor 202, the second transistor 204, the first resistor 218, the first current source 220, the second current source 222, the second resistor 236, the third resistor 238, an example first bias resistor 402, an example second bias resistor 404, an example first inductor 406, and an example second inductor 408.

FIG. 4 includes the first transistor 202 and the second transistor 204 to buffer the boosted input signal for a second stage amplifier (e.g., the second stage amplifier 118 of FIG. 1). In some examples, the first transistor 202 and the second transistor 204 are differential BJTs, wherein the second transistor 204 may receive an adjusted input signal that is 180 degrees out-of-phase with the input signal on input 106 of the first transistor 202. The first transistor 202 and the second transistor 204 have respective current terminals, so the current terminals are the base terminals, the collector terminals and the emitter terminals. In some examples, the second transistor 204 is a differential transistor with differential current terminals, so the differential current terminals are the differential base terminals, differential collector terminals, and different emitter terminals. The first transistor 202 and second the transistor 204 are described above in connection with FIG. 2.

FIG. 4 includes the first resistor 218 coupled between supply voltage 112 and collector node 207. The first resistor 218 biases the Vce of the first transistor 202 and the second transistor 204 within the operating range of the first transistor 202 and the second transistor 204. In some examples, Vsupply 112 provides a voltage too large for the transistors 202, 204 to handle, so the first resistor 218 is configured to reduce that voltage.

FIG. 4 includes the first current source 220 and the second current source 222 to bias the current at the first emitter terminal 210 and the second emitter terminal 216 of the first and second transistors 202, 204. Also, the differential current source (e.g., second current source 222) receives a differential input voltage relative to the voltage at Vbias 110 provided to the first control terminal 226. The first current source 220 and the second current source 222 are described above in connection with FIG. 2.

FIG. 4 includes the second resistor 236 and the third resistor 238 to minimize noise produced at the first source terminal 228 and the second source terminal 234. Also, R2 236 and R3 238 set the voltage at the first source terminal 228 and the second source terminal 234. The second resistor 236 and the third resistor 238 are described above in connection with FIG. 2.

FIG. 4 includes an example first bias resistor 402 and an example second bias resistor 404. The first bias resistor 402 is coupled between the Vbias 110 and the first control terminal 226 of the first current source 220. The second bias resistor 404 is coupled between Vbias 110 and the second control terminal 232 of the second current source 222.

FIG. 4 includes the first inductor 406 and the second inductor 408. The first inductor 406 is coupled between the second resistor 236 and a ground terminal. The second inductor 408 is coupled between the third resistor 238 and a ground terminal.

In an operation of the buffer 108 of FIG. 4, when a voltage is applied to the input 106, the differential of the voltage on the input 106 is applied to the second base terminal 214 of the second transistor 204. For example, the voltage applied to the first base terminal 208 on input 106 is inverted and applied to the second base terminal 214. In response to the swinging input voltage signal at the first base terminal 208, the first emitter terminal 210 replicates the input voltage signal. For example, if the input voltage signal is swinging from 1 volt to −1 volt, the output voltage signal at the first emitter terminal 210 is swinging from 0.7 volts below 1 volts to 0.7 volts below −1 volt. The output of the emitter terminal 210, and any emitter terminal of a BJT, is a diode voltage (e.g., 0.7 volts) below the voltage applied to the base terminal because a voltage drop exists across the BJT device (e.g., first transistor 202) when turned on. The voltage at the first emitter terminal 210 is also the voltage at the first drain terminal 224 of the current source 220. In this manner, the voltage at the first drain terminal 224 swings when the input voltage signal at the first base terminal 208 is swinging.

In an example implementation without the inductors 406, 408 and the bias resistors 402, 404, the current sources 220 and 222 would fail if the swinging of the input signal decreases below the headroom value of the current sources 220 and 222. Also, a reliability constraint may exist if the swinging of the input signal increase above the allowed Vds value of the current sources 220, 222. However, the buffer 108 of FIG. 4 includes the first bias resistor 402 and the first inductor 406, which is a configuration that provides two main advantages. The first advantage achieves a voltage swing at first source terminal 228 when the voltage at the input 106 is swinging, so the bias resistor 402 and inductor 406 cause the voltage at the first control terminal 226 and the voltage at the first source terminal 228 to float and move responsive to the voltage swing at the first drain terminal 224, thereby maintaining MOSFET headroom. For example, the voltage at the first control terminal 226 and the voltage at the first source terminal 228 increase and decrease in unison with the voltage at the first drain terminal 224, such that the voltages at the first control terminal 226 and the first source terminal 228 increase responsive to the voltage at the first drain terminal 224 increasing and decrease responsive to the voltage at the first drain terminal 224 decreasing. The second advantage of the example bias resistor/inductor configuration is that the bias resistor/inductor configuration regulates the drain-to-source voltage of the current source 220, thereby preventing the current source 220 from "crunching" (e.g., compressing) responsive to large voltage swings. In this manner, the first bias resistor 402 in operation with the first inductor 406 implements a high signal operation of the first stage amplifier 102 of FIG. 1, so the first stage amplifier 102 can boost a large signal without clipping or damaging the buffer 108 of FIG. 1.

In relation to the first advantage of the example bias resistor/inductor configuration, the bias resistors 402 and 404 are set to be a large value (e.g., 1 kilohm or 10 kilohms) to present a high impedance on the first control terminal 226. The high impedance of the bias resistor 402 allows the voltage swing of the first drain terminal 224 to develop at the terminals of the current source 220 (e.g., the first control terminal 226 and the first source terminal 228). For example, a MOSFET does not have gate current (e.g., the control terminal of a MOSFET is isolated from the substrate of the MOSFET by a dielectric medium that does not allow current conduction from the control terminal to the drain and source terminals). In this manner, the DC biasing of the first current source 220 (which is biased by the voltage at Vbias 110) is not affected by the first bias resistor 402 because: (a) whatever voltage is applied across the first bias resistor 402 will also be applied at the first control terminal 226; and (b) no current flows through the first bias resistor 402. In this manner, the first current source 220 receives the correct gate voltage.

However, from an AC perspective, when the voltage at the first drain terminal 224 starts swinging, the voltage at the first control terminal 226 starts swinging. For example, the first bias resistor 402 allows the voltage at the first control terminal 226 to float instead of holding the voltage at a fixed value. Therefore, when the voltage at the first drain terminal 224 begins to swing, the first bias resistor 402 achieves the voltage swing at the first control terminal 226 while the drain voltage is swinging.

The first bias resistor 402 ensures that the Vgs of the first current source 220 remains constant. For example, resistance set by a resistor (e.g., first bias resistor 402) determines the voltage across that resistor. By ensuring the Vgs of the first current source 220 remains constant, the current (e.g., the current set by the Vgs and the Vds of the MOSFET) in the first current source 220 is not modulated. In this manner, the first bias resistor 402 and the first inductor 406 increase linearity of the current source, which represents the incoming voltage on the input 106 at the output 114.

The second advantage of the example bias resistor/inductor configuration is that the first current source 220 will not compress when the voltage at the input 106 approaches a threshold voltage. For example, the first current source 220 will not compress if a large voltage swing is applied to the first drain terminal 224 responsive to a large voltage swing at the input 106. For example, if an inductor is not coupled between the end of a source terminal and a ground or supply terminal (e.g., the buffer of FIG. 2), then the source terminal remains constant. In such examples, the source terminal 228 of the MOSFET may be held at a ground potential or a voltage supply potential. However, by including the first inductor 406, the voltage at the first source terminal 228 can swing below ground potential or above supply voltage potential.

The first bias resistor 402 allows the voltage at the first control terminal 226 to swing with the drain voltage because the voltage across an inductor is determined by L (e.g., the inductance value) multiplied by di/dt (e.g., the time of the rate of change of current in the inductor). When the voltage at the input 106 to the buffer 108 is swinging down (e.g., the voltage is decreasing), the Vce is increasing, thereby causing the instantaneous current to increase at collector terminal 206, and likewise at the inductor 406. This implies that the voltage across the inductor 406 should be positive, which can occur if a voltage at the node between R2 236 and L1 406 swings below ground. The voltage across the inductor 406 is defined as the fixed potential (e.g., ground) minus the voltage on the other terminal of the inductor (e.g., the terminal coupled to R2 236). The fixed potential minus a negative voltage generates a positive voltage. When a voltage at the input 106 to the buffer 108 swings up (e.g., the voltage increases), the Vce of the first transistor 202 decreases, thereby causing the instantaneous current to decrease at the collector terminal 206, and likewise at the inductor 406. In response to the decrease in instantaneous current, a negative potential develops across inductor 406. The negative potential occurs when a voltage at the node between R2 236 and L1 406 swings above ground. The fixed potential minus a positive voltage generates a negative voltage across the inductor 406.

An example inductor has a coil of wire wound around a central core. The inductors 406, 408 may be compact low Q inductors with a value of Henries determined by the frequency of the amplification system 100 of FIG. 1. For example, the first inductor 406 is smaller inductance (e.g., nanohenries) for higher frequencies and a larger inductance (e.g., microhenries) for lower frequencies. Q factor (Q) is a measure of the dissipative characteristic of an inductor. High Q inductors have low dissipation and are useful to make finely-tuned, narrow-band circuits. Low Q inductors have higher dissipation that results in wideband performance. The low Q inductor has higher resistive losses, which can be traded off with the resistor value of R2 236 and R3 238.

Figure 5:
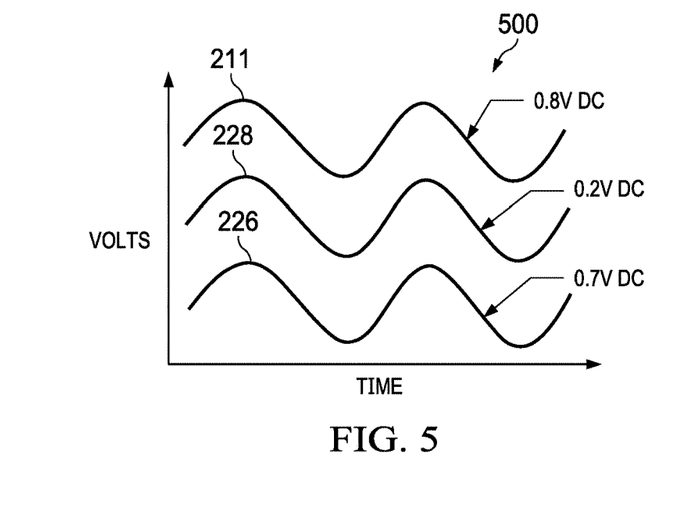
FIG. 5 is a signal plot illustrating voltage signals of the buffer of FIG. 4.

The inductor 406 allows the buffer 108 to operate in a specified manner when the incoming voltage signal on input 106 is greater than a voltage that the current source 220 can handle. For example, referring to FIG. 5, the signal plot 500 illustrates the voltage at the emitter node 211, the voltage at the first source terminal 228, and the voltage at the first control terminal 226. The voltage at the first control terminal 226 is floating due to the first bias resistor 402. The bias resistor 402, described above in connection with FIG. 4, facilitates the voltage at the first control terminal 226 to move responsive to the voltage at the emitter node 211. Also, due to the first inductor 406, the voltage at the first source terminal 228 also floats responsive to the voltage at the emitter node 211.

Figure 6:
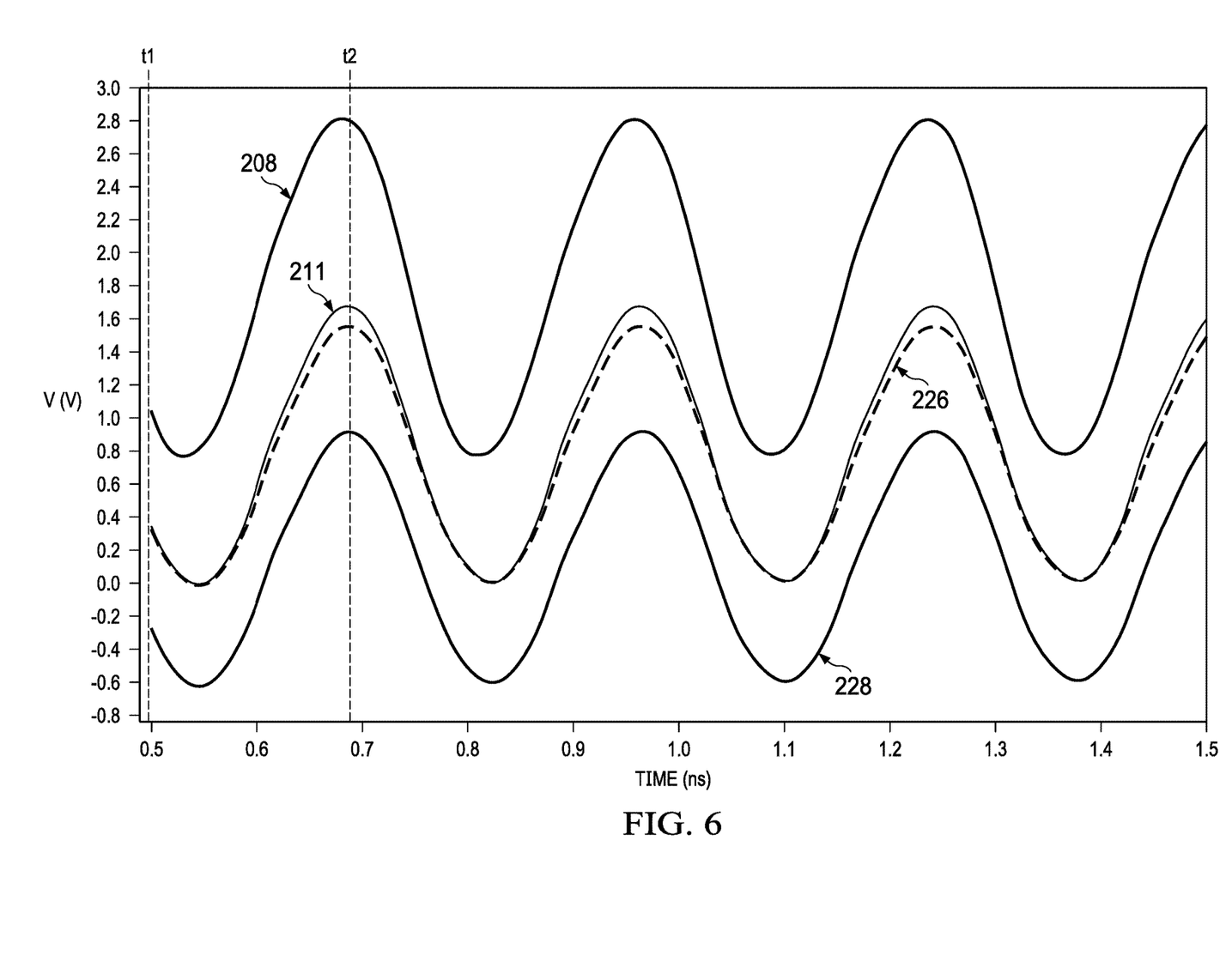
FIG. 6 is a simulated signal plot illustrating the voltage through the buffer of FIG. 4.

FIG. 6 is a simulated signal plot 600 illustrating the voltage through the buffer 108 of FIG. 4. The simulated signal plot 600 includes the voltage at the first base terminal 208, the voltage at the emitter node 211, the voltage at the first control terminal 226, and the voltage at the first source terminal 228.

As shown in FIG. 6, at time t1, the voltage at the first base terminal 208 is approximately 1 volt. In some examples, the 1 volt represents a value of voltage corresponding to the incoming input signal 106, so an amplifier (e.g., the first stage amplifier 102) outputs 1 volt to the buffer 108 (e.g., or to the buffer 108 with the bias resistors 402, 404 and inductors 406, 408).

At time t1, the voltage at the emitter node 211 is approximately 0.3 volts. The voltage at the emitter node 211 is approximately 0.3 volts because the diode drop of the first transistor 202 is 0.7 volts, so the first transistor 202 drops 0.7 volts across the collector to emitter terminals, and the output is 0.7 volts below the voltage at the base terminal 208.

In FIG. 6, the voltage at the first control terminal 226 is represented as a dashed line. At time t1, the voltage at the first control terminal 226 is equal to the voltage at the emitter node 211. For example, the bias resistor 402 sets the voltage at the first control terminal 226 to follow/swing with the voltage at the emitter node 211. In a similar manner as the first transistor 202, the first current source 220 has a threshold voltage of 0.7 volts. Accordingly, at time t1, the voltage at the first source terminal 228 is one threshold voltage below the voltage at the first control terminal 226. For example, at time t1, the voltage at the first source terminal 228 is equal to −0.3 volts.

In this manner, the simulated signal plot 600 illustrates the voltage at the first source terminal 228 dropping below zero volts (e.g., ground potential). This is a result of the first inductor 406 allowing positive or negative voltage to build across the inductor 406, because the voltage polarity is determined by the rate of change of current in the inductor 406. Decreasing AC current implies negative voltage across the inductor 406, while increasing AC current implies positive voltage across the inductor 406.

At time t2, the voltage at the first base terminal 208 increases to approximately 2.8 volts. For example, the incoming voltage signal on the input 106 is swinging, so it is increasing and decreasing. At time t2, the voltage at the emitter node increases responsive to the voltage at the first base terminal 208 increasing. The voltage increase at the emitter node 211 is one diode drop below the voltage increase at the first base terminal 208.

In response to the voltage at the emitter node 211 increasing at time t2, the voltage at the first control terminal 226 and the voltage at the first source terminal 228 increase responsive to the voltage at the emitter node 211. For example, the voltage at the first control terminal 226 follows the voltage at the emitter node 211, and the voltage at the first source terminal 228 increases by one threshold voltage below the voltage at the first control terminal 226.

Figure 7:
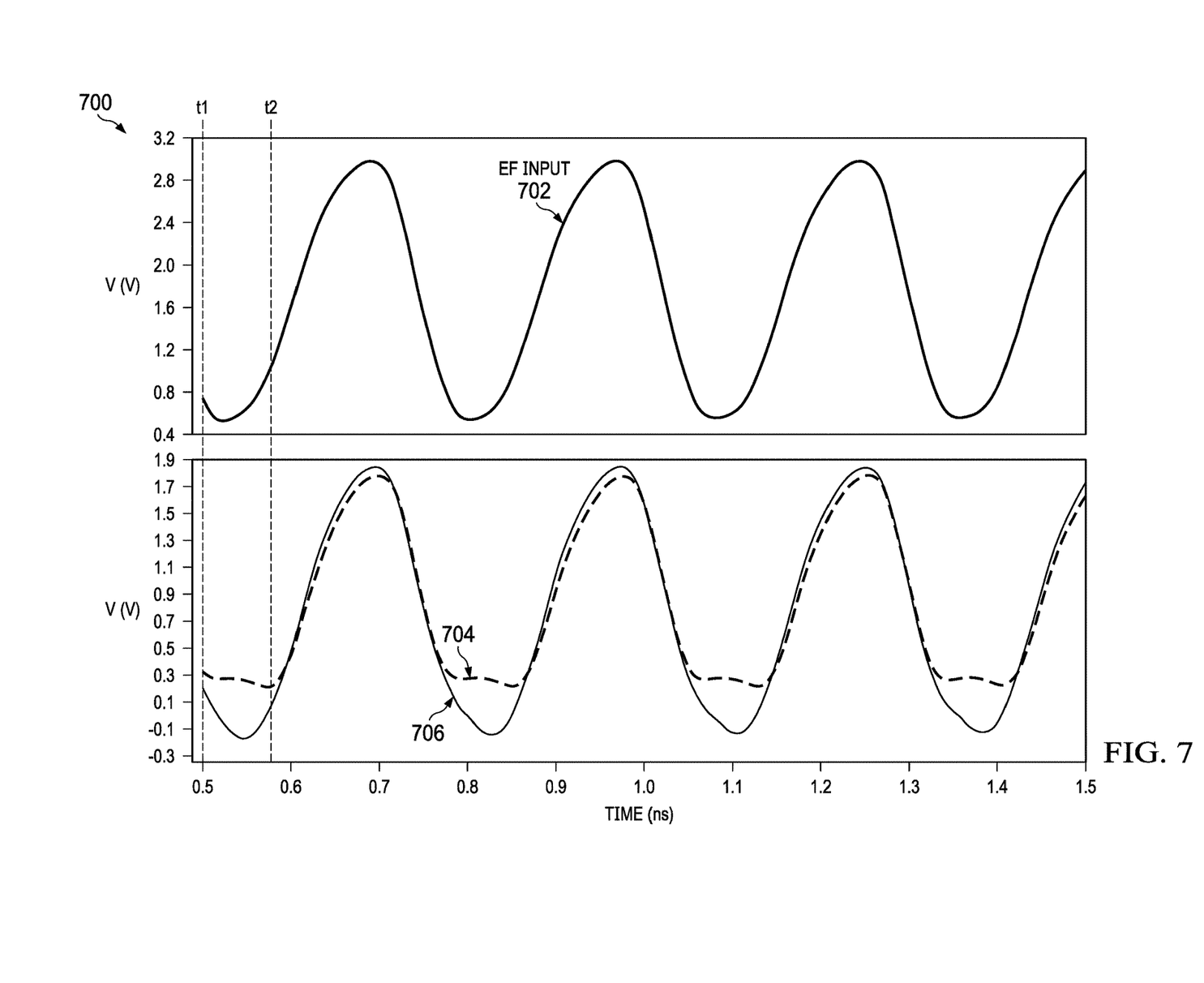
FIG. 7 is a signal plot contrasting operation of the buffers of FIGS. 2 and 4.

FIG. 7 is a signal plot 700 contrasting the operation of the buffer 108 of FIG. 4 and the buffer of FIG. 2. In FIG. 7, the signal plot 700 displays the response of the voltage on the emitter node 211 when the input voltage on input 106 is increasing and decreasing. For example, three voltages are represented in FIG. 7. The input voltage 702 represents the voltage on input 106 of FIGS. 1, 2 and 4. The first voltage signal 704, illustrated as a dashed line, represents the voltage at the emitter node 211 of buffer without the bias resistor 402 and the inductor 406. The second voltage signal 706 represents the voltage at the emitter node 211 of the buffer 108 of FIG. 4.

In FIG. 7, the input voltage 702 is swinging. For example, the input voltage at time t1 is at a value of 0.5 volts, and at time t2 increases to 3 volts. The increasing and decreasing of input voltage 702 continues as time increases.

The first voltage signal 704, corresponding to the voltage at the emitter node 211 of the buffer without the bias resistor 402 and inductor 406, is represented as a dashed line. At time t1, the first voltage signal 704 does not decrease beyond approximately 0.3 volts. In fact, the signal plot 700 depicts the first voltage signal 704 clipping at time t1 to time t2. The first voltage signal 704 clips responsive to the input voltage 702 decreasing beyond the headroom set by the current source 220 of FIG. 2.

The second voltage signal 706, corresponding to the voltage at the emitter node 211 of the buffer 108 of FIG. 4, shows an improvement over the first voltage signal 704. For example, from time t1 to time t2, the second voltage signal 706 decreases responsive to the input voltage 702. In this manner, the second voltage signal 706 does not clip when the voltage at the source terminal 228 decreases.

Figure 8:
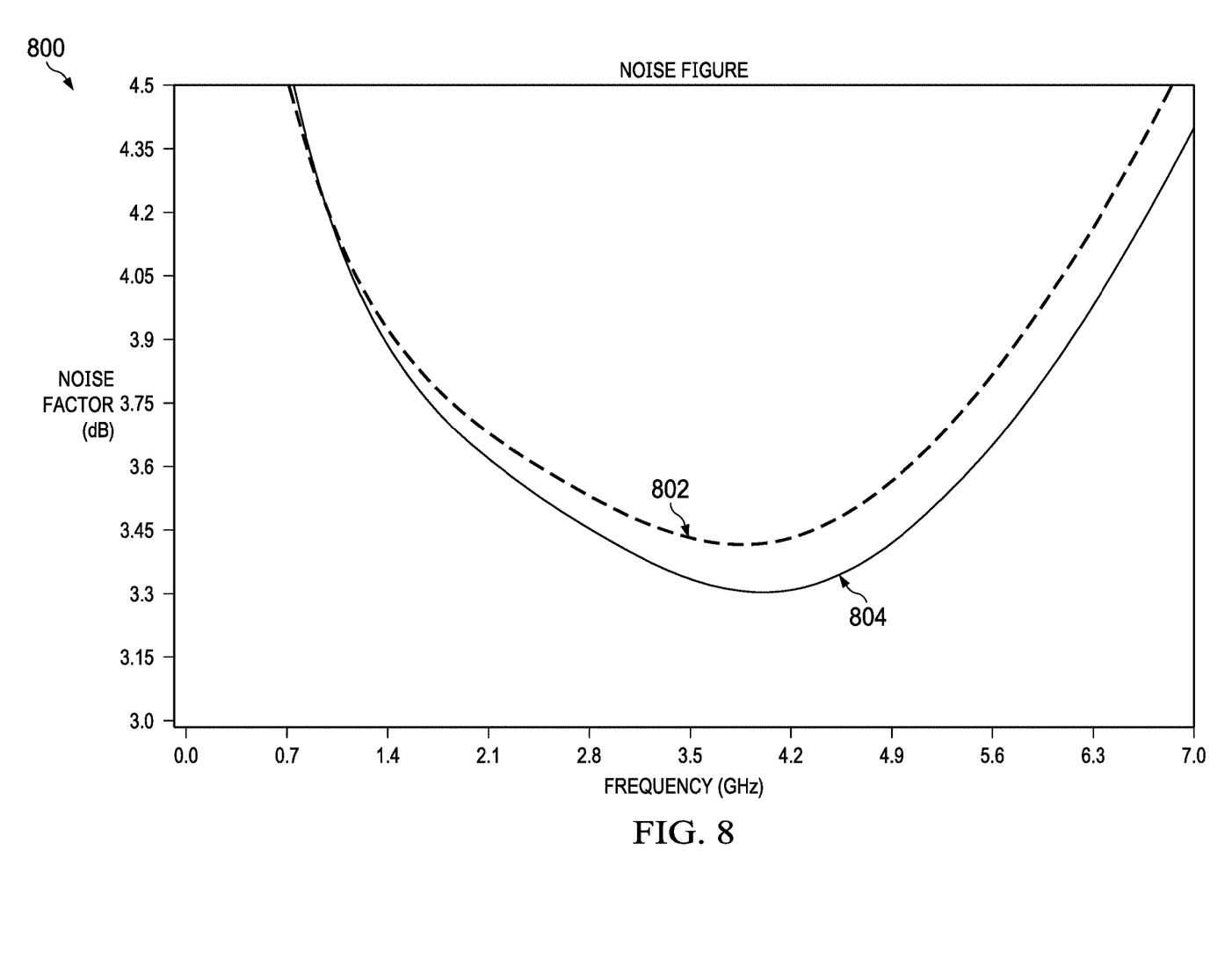
FIG. 8 is a noise figure plot contrasting the noise factor of the buffers of FIGS. 2 and 4.

FIG. 8 is a noise figure plot 800 contrasting the noise factor of the buffer 108 of FIG. 4 and the buffer of FIG. 2. In FIG. 8, the noise figure plot 800 displays the response of the noise factor of the buffer 108 of FIG. 4 and the noise factor of the buffer of FIG. 2 when the frequency at the input 106 is increasing.

A noise factor is a measure of degradation of the signal-to-noise ratio of a circuit, caused by components in a signal chain. The noise factor is a number by which the performance of an amplifier or a radio receiver can be specified, with lower values indicating better performance. The noise factor is measure in decibels (dB).

In FIG. 8, the first noise factor 802, illustrated as a dashed line, corresponds to the buffer without the bias resistor 402 and inductor 406. The first noise factor 802 is represented as a dashed line. In the illustrated example, at a frequency of approximately 4 gigahertz (GHz), the first noise factor 802 equals approximately 3.45 decibels. In this manner, when the frequency at the input 106 of the buffer equals 4 gigahertz, the noise factor equals 3.45 decibels.

In FIG. 8, the second noise factor 804 corresponds to the buffer 108 of FIG. 4. The second noise factor 804 is represented as a solid line. In the illustrated example, when the frequency at the input 106 equals 4 gigahertz, the second noise factor 804 equals 3.3 decibels. The overall noise in the buffer 108 is reduced relative to the overall noise in the buffer without the resistor/inductor configuration. For example, the bias resistor/inductor configuration gives the current source 220 more voltage headroom, thereby reducing the noise factor of the current source 220 and further reducing the overall noise in the buffer 108. In this manner, the buffer 108 shows an improvement in noise factors relative to the buffer of FIG. 2 (which does not include the bias resistor 402 and inductor 406).

In this description, the term "and/or" (when used in a form such as A, B and/or C) refers to any combination or subset of A, B, C, such as: (a) A alone; (b) B alone; (c) C alone; (d) A with B; (e) A with C; (f) B with C; and (g) A with B and with C. Also, as used herein, the phrase "at least one of A or B" (or "at least one of A and B") refers to implementations including any of: (a) at least one A; (b) at least one B; and (c) at least one A and at least one B.

Example methods, apparatus and articles of manufacture described herein improve linearity of a voltage buffer, such as an emitter follower, source follower, etc. In examples described herein, the linearity of a voltage buffer is improved by floating the control terminal of a current source via a bias resistor. Also, an inductor minimizes and/or reduces compression of a current source when an input signal is greater than a switching device (such as a MOSFET or BJT) can handle. Further, the bias resistor/inductor configuration protects the current source of a buffer against compressing or becoming damaged when an input signal exceeds a threshold set by the manufacturer of the current source.

Modifications are possible in the described embodiments, and other embodiments are possible, within the scope of the claims.

What is claimed is:

1. An apparatus, comprising:
a voltage follower circuit having a voltage follower input, a power terminal, and a voltage follower output, the voltage follower circuit including a first transistor coupled between the power terminal and the voltage follower output, the first transistor including a bipolar junction transistor BJT) and having a first control terminal coupled to the voltage follower input;
an inductor having first and second inductor terminals, the first inductor terminal coupled to a ground terminal; and
a current source coupled between the voltage follower output and the second inductor terminal, the current source including a second transistor, the second transistor including a field effect transistor (FET) and having a second control terminal coupled to a bias input.

2. The apparatus of claim 1, wherein the voltage follower input is a first voltage follower input, the voltage follower output is a first voltage follower output, the current source is a first current source, the inductor is a first inductor, and the apparatus further comprises:
a second voltage follower circuit having a second voltage follower input, the power terminal, and a second voltage follower output, the second voltage follower circuit including a third transistor coupled between the power terminal and the second voltage follower output, the third transistor having a third control terminal coupled to the second voltage follower input;
a second inductor having third and fourth inductor terminals, the third inductor terminal coupled to the ground terminal; and
a second current source coupled between the second voltage follower output and the fourth inductor terminal, the second current source including a fourth transistor having a fourth control terminal coupled to the bias input.

3. The apparatus of claim 2, further comprising: a first resistor coupled between the bias input and the second control terminal, and a second resistor coupled between the bias input and the fourth control terminal.

4. The apparatus of claim 1, further comprising a resistor coupled between the bias input and the second control terminal.

5. An apparatus, comprising:
a voltage follower circuit having a voltage follower input, a power terminal, and a voltage follower output, the voltage follower circuit including a first transistor coupled between the power terminal and the voltage follower output, the first transistor including a bipolar junction transistor (BJT) and having a first control terminal coupled to the voltage follower input;
a current source coupled between the voltage follower output and a ground terminal, the current source including a second transistor, the second transistor including a field effect transistor (FET) and having a second control terminal; and
a resistor coupled between a bias input and the second control terminal.

6. The apparatus of claim 5, wherein the resistor is a first resistor, and the apparatus further includes a second resistor having first and second resistor terminals, the first resistor terminal coupled to the power terminal, and the first transistor coupled between the second resistor terminal and the voltage follower output.

7. The apparatus of claim 5, wherein a first impedance of the resistor is higher than a second impedance of the second control terminal.

8. The apparatus of claim 5, further comprising an inductor having first and second inductor terminals, the first inductor terminal coupled to the ground terminal, and the second transistor coupled between the second inductor terminal and the voltage follower output.

9. The apparatus of claim 5, wherein the resistor is a first resistor, the voltage follower input is a first voltage follower input, the voltage follower output is a first voltage follower output, the current source is a first current source, and the apparatus further comprises:
a second voltage follower circuit having a second voltage follower input, the power terminal, and a second voltage follower output, the second voltage follower circuit including a third transistor coupled between the power terminal and the second voltage follower output, the third transistor having a third control terminal coupled to the second voltage follower input;
a second current source coupled between the second voltage follower output and the ground terminal, the second current source including a fourth transistor having a fourth control terminal; and
a second resistor coupled between the bias input and the fourth control terminal.

10. The apparatus of claim 9, further comprising a second inductor having third and fourth inductor terminals, the third inductor terminal coupled to the ground terminal, and the fourth transistor coupled between the second voltage follower output and the fourth inductor terminal.

11. The apparatus of claim 9, wherein the first and second voltage follower inputs are differential inputs, and the first and second voltage follower outputs are differential outputs.

12. An apparatus, comprising:
a first voltage follower circuit having a first voltage follower input, a power terminal, and a first voltage follower output, the first voltage follower circuit including a first transistor coupled between the power terminal and the first voltage follower output, the first transistor including a bipolar junction transistor (BJT) and having a first control terminal coupled to the first voltage follower input;
a first current source coupled between the first voltage follower output and a ground terminal, the first current source including a second transistor, the second transistor including a field effect transistor (FET) and having a second control terminal;
a second voltage follower circuit having a second voltage follower input, the power terminal, and a second voltage follower output, the second voltage follower circuit including a third transistor coupled between the power terminal and the second voltage follower output, the third transistor including a BJT and having a third control terminal coupled to the second voltage follower input;

a second current source coupled between the second voltage follower output and the ground terminal, the second current source including a fourth transistor, the fourth transistor including a FET and having a fourth control terminal;

a first resistor coupled between a bias input and the second control terminal; and a second resistor coupled between the bias input and the fourth control terminal.

13. The apparatus of claim 12, wherein the first and third transistors include respective N-type BJTs, and the second and fourth transistors include respective NFETs.

14. The apparatus of claim 12, further comprising:

a first inductor having first and second inductor terminals, in which the first inductor terminal is coupled to the ground terminal, and the second transistor is coupled between the first voltage follower output and the second inductor terminal; and a second inductor having third and fourth inductor terminals, in which the third inductor terminal is coupled to the ground terminal, and the fourth transistor is coupled between the second voltage follower output and the fourth inductor terminal.

15. The apparatus of claim 12, further comprising a third resistor having first and second resistor terminals, the first resistor terminal coupled to the power terminal, the first transistor coupled between the second resistor terminal and the first voltage follower output, and the third transistor coupled between the second resistor terminal and the second voltage follower output.

16. The apparatus of claim 12, wherein the first and second voltage follower inputs are differential inputs, and the first and second voltage follower outputs are differential outputs.

17. The apparatus of claim 2, wherein the first and second voltage follower inputs are differential inputs, and the first and second voltage follower outputs are differential outputs.

18. The apparatus of claim 3, wherein the first resistor is configured to isolate the first control terminal from the second voltage follower input, and the second resistor is configured to isolate the second control terminal from the first voltage follower input.

19. The apparatus of claim 9, wherein the first resistor is configured to isolate the first control terminal from the second voltage follower input, and the second resistor is configured to isolate the second control terminal from the first voltage follower input.

* * * * *